United States Patent
Garside et al.

(10) Patent No.: US 10,942,234 B2
(45) Date of Patent: Mar. 9, 2021

(54) REDUCTION OF BLOCKAGES IN A CRYOGENIC REFRIGERATION SYSTEM SUCH AS FOR MAGNETIC RESONANCE IMAGING SYSTEMS

(71) Applicant: Oxford Instruments Nanotechnology Tools Limited, Oxon (GB)

(72) Inventors: John Garside, Witney (GB); Timothy John Foster, Oxford (GB)

(73) Assignee: OXFORD INSTRUMENTS NANOTECHNOLOGY TOOLS LIMITED, Oxon (GB)

( * ) Notice: Subject to any disclaimer, the term of this patent is extended or adjusted under 35 U.S.C. 154(b) by 1360 days.

(21) Appl. No.: 14/408,501

(22) PCT Filed: Apr. 19, 2013

(86) PCT No.: PCT/GB2013/050999
§ 371 (c)(1),
(2) Date: Dec. 16, 2014

(87) PCT Pub. No.: WO2013/190263
PCT Pub. Date: Dec. 27, 2013

(65) Prior Publication Data
US 2015/0153427 A1    Jun. 4, 2015

(30) Foreign Application Priority Data

Jun. 20, 2012    (GB) .................................... 1210927

(51) Int. Cl.
*F25B 9/14*    (2006.01)
*G01R 33/38*    (2006.01)
(Continued)

(52) U.S. Cl.
CPC .......... *G01R 33/3804* (2013.01); *B01D 8/00* (2013.01); *F17C 3/085* (2013.01); *F25B 9/00* (2013.01);
(Continued)

(58) Field of Classification Search
CPC .............. B01D 8/00; F17C 3/085; F25B 9/02
See application file for complete search history.

(56) References Cited

U.S. PATENT DOCUMENTS

| 3,792,591 A |   | 2/1974 | Collins |              |
| 4,717,406 A | * | 1/1988 | Giacobbe | ............... B01D 37/00 |
|             |   |        |          | 62/46.1       |

(Continued)

FOREIGN PATENT DOCUMENTS

| JP | H079960 A  | * | 8/1989 |                |
| JP | 2003-079960 |   | 4/1991 |                |
| JP | H0379960 A | * | 4/1991 | ................ F25B 9/00 |

OTHER PUBLICATIONS

Translation of JPH0379960A, "Apparatus for removal of hydrogen or the like in helium refrigerated liquefaction machine" provided by EscapeNet on Apr. 4, 1991.*

*Primary Examiner* — Elizabeth J Martin
*Assistant Examiner* — Nael N Babaa
(74) *Attorney, Agent, or Firm* — Blank Rome LLP (57) ABSTRACT

A cryogenic refrigeration system is provided having particular application in cooling a Magnetic Resonance Imaging system. The cryogenic refrigeration system comprises a conduit arranged as a cooling circuit through which a coolant fluid is pumped, the conduit being in thermal communication with a least one cooled stage for cooling the coolant fluid to a first temperature, and wherein the conduit comprises a cryotrap in communication with the coolant fluid, the cryotrap being operable to remove contaminants from the coolant fluid by cryogenic pumping. The conduit (Continued)

further comprises a flow impedance for cooling the coolant fluid to a second temperature lower than the first temperature, and a hydrogen filter upstream of the flow impedance and in communication with the coolant fluid, the hydrogen filter being cooled to a temperature below the freezing point of hydrogen in the coolant fluid and operable to remove contaminant hydrogen from the coolant fluid.

18 Claims, 2 Drawing Sheets

(51) Int. Cl.
*F25B 9/00* (2006.01)
*F17C 3/08* (2006.01)
*F25B 9/12* (2006.01)
*F25B 9/02* (2006.01)
*B01D 8/00* (2006.01)
*F25B 43/00* (2006.01)

(52) U.S. Cl.
CPC .................. *F25B 9/02* (2013.01); *F25B 9/12* (2013.01); *F25B 9/14* (2013.01); *F25B 9/145* (2013.01); *F25B 43/003* (2013.01)

(56) References Cited

U.S. PATENT DOCUMENTS

| | | | |
|---|---|---|---|
| 6,968,713 B2 * | 11/2005 | Corrigan ............ | B01D 53/0415 62/474 |
| 7,506,504 B2 * | 3/2009 | Kumar .................. | F01N 3/0222 422/170 |
| 2005/0257534 A1 | 11/2005 | Arman et al. | |
| 2010/0263358 A1 * | 10/2010 | Chen ..................... | F01N 3/2828 60/299 |
| 2011/0219785 A1 * | 9/2011 | Black .................... | F17C 13/007 62/3.1 |

* cited by examiner

REDUCTION OF BLOCKAGES IN A CRYOGENIC REFRIGERATION SYSTEM SUCH AS FOR MAGNETIC RESONANCE IMAGING SYSTEMS

REFERENCE TO RELATED APPLICATION

This is a national phase of PCT/GB2013/050999, filed Apr. 19, 2013, which claims priority to Great Britain Application No. 1210927.8, filed Jun. 20, 2012. The entire contents of those applications are hereby incorporated by reference.

FIELD OF THE INVENTION

The present invention relates to the reduction of blockages in cryogenic refrigeration systems, and in particular but not exclusively to closed-cycle refrigeration systems. The invention finds particular advantage when embodied in the cooling system of a Magnetic Resonance Imaging (MRI) system.

BACKGROUND TO THE INVENTION

In closed-cycle refrigeration systems (of which Joule-Thomson coolers are a common example), a working fluid such as helium-3 or helium-4 flows continuously through pipework arranged to form a leak-tight closed-loop circuit. The flow around the circuit is typically generated by a room-temperature pump, compressor or combination thereof.

The room temperature working fluid supplied by the pump or compressor is fed through the circuit into a cryostat where it is cooled by successive heat exchange with cooled stage(s). The cooled stage(s) may be provided by a cryocooler such as a pulse tube refrigerator or Gifford McMahon cooler, or alternatively by a reservoir containing a liquid cryogen. The working fluid is then cooled further by isenthalpic expansion though a flow impedance within the circuit. Temperatures below 1.5K (using helium-4) or 0.3K (using helium-3) may be obtained by using such a closed-cycle refrigeration system. Following the expansion, there is thermal exchange with the sample to be cooled, and the working fluid is returned to the pump or compressor at room temperature to re-start the cycle. Closed-cycle refrigeration systems may therefore be used in cooling apparatus for medical purposes such as MRI systems.

Another example of a closed cycle refrigerator is a dilution refrigerator, which contains additional low temperature cooling stages within the flow circuit and which may optionally contain additional branches within the closed circuit to allow for pre-cooling. Dilution refrigerators again typically contain an impedance acting as a cooling stage.

A problem arises due to the progressive cooling of the working fluid from room temperature at the pump or compressor down to cryogenic temperatures within the cryostat. As the cooling occurs, undesirable contaminants within the working fluid liquefy or freeze out at their respective liquefaction and freezing points. This leads to a gradual blocking of the pipes, heat exchangers and the flow impedance(s) within the system. This blocking reduces the cooling power being delivered to the sample to be cooled, and also reduces efficiency as the system must be regularly cleaned to remove the blockages. Joule Thomson coolers are particularly prone to blockages due to their relatively narrow pipework and the flow impedance itself, which is typically a significant narrowing of the fluid path. Such blockages and frequent cleaning are unacceptable in applications such as medical MRI systems where a large number of patients may need to be scanned and long periods of downtime are undesirable.

Further, during thermal cycling (warming up and cooling down) of the refrigeration system, a more rapid blocking mechanism occurs. The level of contaminants in the working fluid typically increases gradually with time meaning that the level of contaminants within the circuit is higher at the end of a long operating period than it is at the start. During a subsequent cool down of the system, due to the different initial flow rates of the working gas and different initial temperature profiles throughout the circuit, the contaminants may freeze out of the working fluid at different locations or in more concentrated locations. This causes particular issues on repeated thermal cycling of cryogenic refrigeration systems.

U.S. Pat. No. 4,717,406 provides a prefilter to remove solid particulates from a working fluid, an adsorbent bed to remove further impurities, and a postfilter to remove entrained particles of adsorbent material from the adsorbent bed. However, there is a continued need to reduce the rate of blockage build-up within closed-cycle refrigeration systems, and cryogenic refrigeration systems in general.

SUMMARY OF THE INVENTION

In accordance with a first aspect of the present invention there is provided a cryogenic refrigeration system comprising a conduit arranged as a cooling circuit through which a coolant fluid is pumped, the conduit being in thermal communication with a least one cooled stage for cooling the coolant fluid to a first temperature, wherein the conduit comprises a cryotrap in communication with the coolant fluid, the cryotrap being operable to remove contaminants from the coolant fluid by cryogenic pumping, and wherein the conduit further comprises a flow impedance for cooling the coolant fluid to a second temperature lower than the first temperature, and a hydrogen filter upstream of the flow impedance and in communication with the coolant fluid, the hydrogen filter being cooled to a temperature below the freezing point of hydrogen in the coolant fluid and operable to remove contaminant hydrogen from the coolant fluid.

In use, coolant fluid within the circuit is cooled by the at least one cooled stage to a base temperature. The coolant fluid is then further cooled by expansion through the flow impedance. The at least one cooled stage may be a cooled stage of a cryocooler such as a pulse tube refrigerator (PTR) or a Gifford McMahon (GM) cooler, or alternatively may be a reservoir containing a cryogenic fluid such as liquid nitrogen. Using a cryocooler is particularly advantageous as it allows the refrigeration system to be "cryogen-free", resulting in a significant reduction in cryogen leakage. Typically, the coolant fluid will be cooled at two or more stages before reaching base temperature. For example, the coolant fluid may be in thermal communication first with a first cooled stage of a two-stage PTR, and subsequently with the second, cooler, stage of the PTR.

We have realised that there are multiple blocking mechanisms within the conduit. The initial blocking is typically caused by air components, such as water, nitrogen and carbon dioxide freezing out of the coolant fluid at the region where the conduit is cooled by the first cooled stage. Eliminating this mechanism revealed a second, more subtle and slower-acting blocking mechanism where gases that cannot be removed by a cryotrap result in contamination and gradual blocking of impedances or thin conduits containing coolant fluid cooled to lower temperatures. We have further realised that hydrogen in particulars remains in the fluid until it precipitates directly within the fluid resulting in "hydrogen snow" which collects at and blocks the impedance. This slower acting mechanism cannot typically be seen until the more rapidly acting mechanisms are resolved.

The combination of a cryotrap and a hydrogen filter within the cryogenic refrigeration system significantly reduces the rate of build-up of blockages due to contaminants within the coolant fluid. This is particularly important as blockages within the conduit reduce the cooling power of the refrigeration system and increase its base temperature. The increased resilience to blockages also increases the run time between blockages, thereby improving efficiency and decreasing downtime of the cryogenic refrigeration system.

The cryotrap is typically located upstream of the hydrogen filter and is operable to remove any molecular or atomic nitrogen, oxygen, argon, carbon dioxide, water and/or hydrocarbon contaminants within the coolant fluid (which is typically helium-3 or helium-4). The contaminant(s) are removed by condensation or freezing out of the coolant fluid onto an active surface within an active region of the cryotrap (a process known as "cryogenic pumping"). The active region of the cryotrap, which is typically a high surface area to volume material, is therefore kept at a temperature lower than the boiling point of the above-mentioned contaminants to enable the cryogenic pumping mechanism to occur. Typically, the cryotrap is in thermal communication with the at least one cooled stage such that its active region is held at the appropriate temperature. Where this is the case, the cryotrap may also act as a heat exchanger between the first cooled stage and the coolant fluid. Alternatively however, the cryotrap may be cooled independently of the coolant fluid. The cryotrap may typically be in thermal communication with the first cooled stage of a two-stage PTR and held at a temperature in the range of approximately 30-77K.

It is important that the active region of the cryotrap is in communication with the coolant fluid as it is pumped through the cooling circuit. In other words, the coolant fluid may pass through, over or past the cryotrap such that contaminants within the coolant fluid may condense or freeze on to the cooled active surface of the cryotrap. Typically, the cryotrap comprises an entrance port and an exit port, the entrance port being upstream of the exit port, such that the coolant fluid enters the cryotrap through the entrance port and flows out of the cryotrap through the exit port. The active region is located between the entrance and exit ports and has an extensive surface area. The cryotrap is preferably arranged in series with the conduit, and may be an integral part of the conduit, although other arrangements are envisaged so long as the coolant fluid is in communication with the cryotrap active surface. For example, the cryotrap may be a removable component such that it may be retro-fitted to an existing refrigeration system, or easily removed and re-connected for maintenance, cleaning and the like.

The cryogenic refrigeration system preferably further comprises a particulate filter downstream of the cryotrap and operable to trap any contaminants originating from wear or breakdown of the cryotrap. This particulate filter may be an integral part of the cryotrap, or may be a separate component from the cryotrap. Typically, the particulate filter is located immediately downstream of the cryotrap.

As described above, the cryogenic refrigeration system comprises a flow impedance for cooling the coolant fluid to a second temperature lower than the first temperature. This is due to isenthalpic expansion of the coolant fluid as it flows from the high pressure side upstream of the impedance to the low pressure side downstream of the impedance. If He-4 is used as the coolant fluid, this process can cool the coolant fluid to typically below 1.5K, and if He-3 is used, the expansion can cool the fluid down to typically below 0.3K. It is important that the flow impedance does not become blocked, as this adversely affects the cooling power generated by the expansion process. In the present invention, the flow impedance is preferably a needle valve, although other suitable impedances may be used, for example a constriction of the conduit or a wire placed inside and partially constricting the conduit over an extended length or a region of conduit filled with extremely fine sintered material.

The walls of the conduit are typically constructed of stainless steel, although other materials may be used. Outgassing of hydrogen from the stainless steel conduit and from other hydrocarbon containing materials such as pump seals and residual process oil within the cryogenic refrigeration system, creates particulate "hydrogen snow" which is formed by said hydrogen gas freezing in the coolant fluid. The cryogenic refrigeration system therefore also comprises the hydrogen filter upstream of the flow impedance in order to prevent the hydrogen snow blocking the flow impedance. The hydrogen filter is cooled to a temperature below that of the freezing point of hydrogen within the coolant fluid such that the trapped hydrogen snow remains in solid form on the filter and does not melt or boil and re-enter the coolant fluid.

Typically, the hydrogen filter comprises a particulate filter to trap the particulate hydrogen snow. The filter preferably has a pitch (here referring to the cross-sectional dimensions of the flow paths within the filter) in the range of 0.01 to 10 microns, and the filter has a large aspect ratio of cross section (perpendicular to the flow direction of the coolant fluid) to thickness which does not substantially affect the flow of the coolant fluid, even during build up of hydrogen within the filter. The filter is typically a sintered metal filter.

In order to maintain the hydrogen filter at a temperature below that of the freezing point of hydrogen within the coolant fluid, the hydrogen filter may be in thermal communication with a second cooled stage, wherein the second cooled stage is cooled when in use to a temperature lower than the freezing point of hydrogen in the coolant fluid. For example, the cryotrap and the hydrogen filter may both be in thermal communication with a two-stage PTR, where the cryotrap is in thermal communication with the first stage, and the hydrogen filter is in thermal communication with the second, cooler, stage. Alternatively, the hydrogen filter may be cooled independently of the PTR and located downstream from the second stage of the PTR. For example, it may be cooled by the coolant fluid passing through the conduit or the flow impedance itself. The hydrogen filter and the flow impedance may be a unitary member, so long as the coolant fluid is in communication with the hydrogen filter before it flows through the impedance itself. Essentially, the coolant fluid flows through the hydrogen filter before subsequently flowing through the flow impedance, with the flow impedance having a much higher impedance to the flow of coolant fluid than the hydrogen filter.

A second mechanism by which the flow impedance is typically blocked by outgassed hydrogen is dendritic crystallisation in and around the impedance. The hydrogen filter is positioned upstream of the impedance and at a temperature low enough to force the dendritic crystallisation to occur predominantly in the filter rather than in the impedance, and has a high cross sectional area (perpendicular to the coolant fluid flow direction) to aid this.

The cryotrap may comprise an associated heater operable to heat the cryotrap when a cooling cycle is complete. Such heating regenerates the cryotrap by evaporating the trapped contaminates. The associated heater may be separate to the cryotrap or an integral part of the cryotrap. In a similar manner, the hydrogen filter may comprise an associated heater which may be an integral part of the hydrogen filter or may be separate. Alternatively, there may be a single heater operable to heat both the cryotrap and the hydrogen filter simultaneously.

The conduit of the cryogenic refrigeration system may also comprise a molecular trap upstream of the cryotrap. This is typically at room temperature and is operable to remove water/moisture and/or hydrocarbon contaminants from the coolant fluid. Such a molecular trap typically comprises a zeolite having a large surface area to adsorb contaminants thereby removing them from the coolant fluid. In a similar manner to the cryotrap described hereinabove, the molecular trap may be an integral part of the conduit, or it may alternatively be a separate member connectable to the conduit. The molecular trap is typically connected in series with the cryotrap.

In a similar manner to the cryotrap and the hydrogen filter described above, the molecular trap may also comprise an associated heater to regenerate the molecular trap after a cooling cycle is complete. The associated heater may be separate to the molecular trap or may be an integral part of the molecular trap. Alternatively, a single heater may heat two or more of the cryotrap, hydrogen filter and molecular trap.

The cryogenic refrigeration system typically comprises a circulation pump (such as a scroll pump or compressor) to pump the coolant fluid around the cooled circuit, and the conduit may further comprise a particulate filter downstream of the pumping means operable to remove contaminants originating from the pumping means (for example particulates resulting from the wear of the tip seals in a scroll pump). Such a particulate filter advantageously further reduces blockages within the system.

Preferably, the at least one cooled stage and the flow impedance are contained within a cryostat, together with the cryotrap and the hydrogen filter. If a molecular trap as described above is also used within the cryogenic refrigerator system, then this is typically at ambient temperature outside of the cryostat. Ambient temperature here is typically "room temperature".

It is to be understood that the term "conduit" relates to any volume through which the coolant fluid can flow. Therefore, the conduit comprises the entire coolant circuit, including each of the cryotrap and hydrogen filter, together with any further optional traps and/or filters. The conduit is typically arranged as a closed-cycle circuit such that the coolant gas flows in a continuous leak-tight circuit through the cryostat. However, in some arrangements, the cooling circuit may not be a "closed" circuit, in that it has two independent ends. The circuit may also have additional branches, such as those in dilution refrigerators.

In a second aspect of the present invention there is provided a cryogenic refrigeration system according to any of the above description of the first aspect, wherein the conduit is arranged as a closed circuit.

The present invention therefore provides a means of significantly reducing the blocking-rate of a cryogenic refrigeration system through the combination of a cryotrap and a hydrogen filter in communication with the coolant fluid being pumped through the system. Further optional traps and filters may be included which further increase the refrigeration system's resilience to blocking.

The cryogenic refrigeration systems in accordance with the invention find particularly advantageous application and use in the field of magnetic resonance, and in particular, magnetic resonance imaging.

In accordance with a third aspect of the invention there is provided a magnetic resonance system comprising: a magnet system comprising a number of magnets for generating a magnetic field which is suitable for obtaining magnetic resonance signals from a target region; a radio frequency system for obtaining radio frequency signals from the target region; a control system for controlling the magnetic fields experienced within different parts of the target region in accordance with the magnet system and radio frequency system; a processing system for forming an image from the radio frequency signals; and, a cooling system adapted in use to cool one or more of the magnet system or radio frequency systems using a cryogenic refrigeration system or a closed circuit refrigeration system in accordance with the first or second aspect.

The magnet system typically includes superconductive magnets and the cooling system typically further comprises a heat transfer medium which is arranged to act as a heat sink for the superconductive magnets and wherein the cryogenic refrigeration system or closed-circuit refrigeration system is operative to extract heat from the heat transfer medium when in use. Such a medium may take the form of a liquid coolant, a gaseous coolant or a solid high thermal conductivity material such as high purity copper.

BRIEF DESCRIPTION OF THE DRAWINGS

The invention will now be described with reference to the following drawings, in which.

DETAILED DESCRIPTION OF THE DRAWINGS

Figure 1:
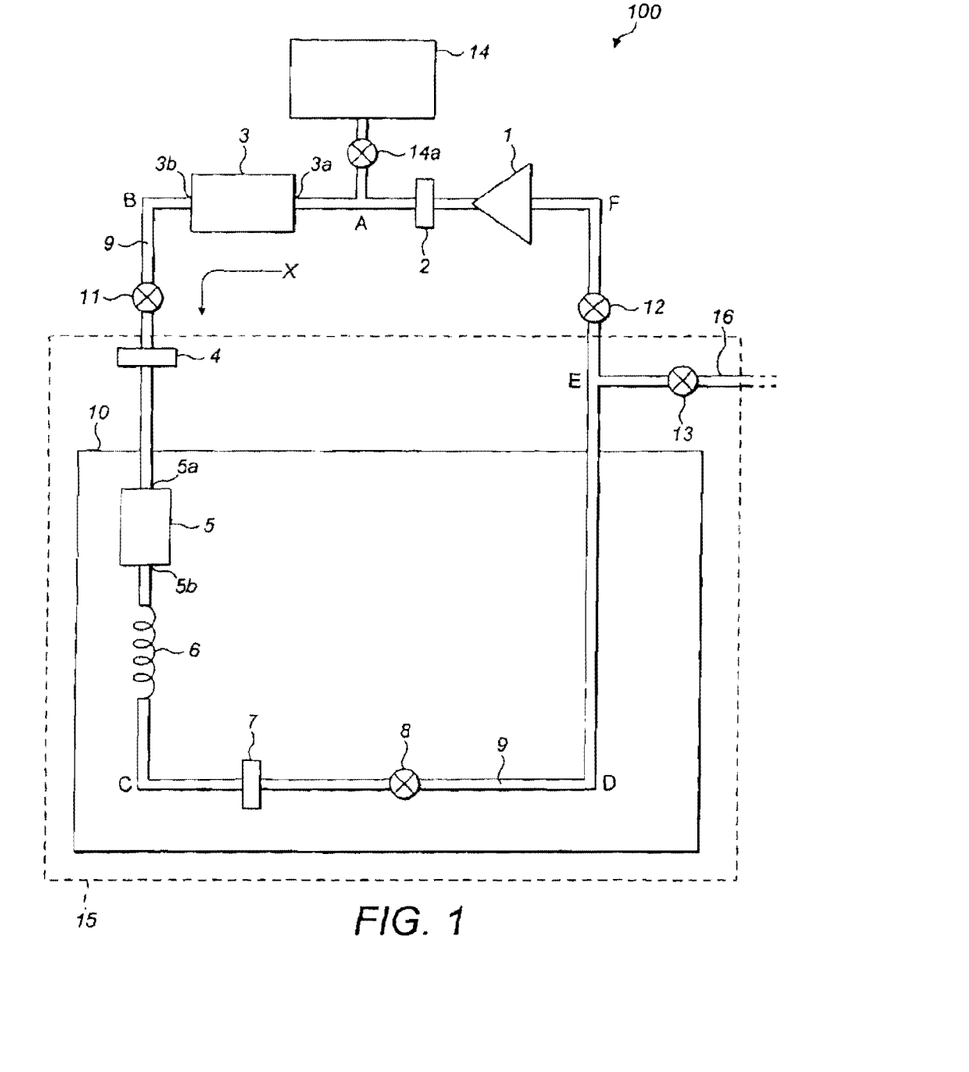
FIG. 1 is a schematic diagram of a cryogenic refrigerator system according to the present invention; and, FIG. 2 is a schematic diagram of a magnetic resonance system incorporating a cryogenic refrigerator system according to the examples.

FIG. 1 is a schematic diagram of a cryogenic refrigeration system 100 according to the present invention. The system 100 comprises a storage tank 14 containing a suitable coolant fluid such as helium-3 or helium-4. When valve 14a is open, coolant fluid flows from storage tank 14 into a conduit 9 along supply conduit 9a. The conduit 9 is essentially a pipe manufactured from stainless steel, although other construction materials are envisaged. The conduit has a circular cross section, although other cross sectional geometries may be used. During a cooling cycle, valves 11 and 12 (described below) are open and valve 13 (described below) is closed such that the conduit 9 forms an endless cooling circuit ABCDEF, as seen in FIG. 1. A circulation pump 1 pumps the coolant fluid through the conduit 9 in an anti-clockwise direction as indicated by arrow X. The conduit may be flexible or rigid as desired in order to effect the continuous cooling circuit.

As will be understood by the skilled person, the arrangement of the cooling tank 14 with respect to the conduit 9 and circulation pump 1 is exemplary only, and other suitable arrangements may be used.

The refrigeration system 100 further comprises a vacuum-insulated cryostat 10, and the conduit 9 is arranged such that the coolant fluid flows from the circulation pump 1 (which is at room temperature) through the cryostat. Within the cryostat 10, the conduit 9 is in thermal communication with the first stage of a two-stage pulse tube refrigerator (PTR, not shown), cooling the coolant fluid to first cooled temperature, typically in the range of approximately 30-77K. The conduit 9 is subsequently in thermal communication with the second stage of the PTR, cooling the coolant fluid to a temperature in the range of approximately 3-20K. Although in the currently described embodiment a PTR is used for cooling the coolant fluid, it will be appreciated that any cryocooler may be used, such as a Gifford McMahon cooler.

The conduit may optionally also be in thermal communication with a tube of the PTR (such as a regenerator tube) through a heat exchanger 6, further cooling the coolant fluid. The heat exchanger is an integral part of the conduit 9, with the conduit cross-section narrowing to form the heat exchanger. The smaller diameter of the conduit at the heat exchanger allows effective heat exchange between the coolant fluid and the PTR tube. Alternatively, the heat exchanger may be a separate, removable part. Heat exchangers similar to that described above may be used to effect the thermal communication between the conduit 9 and the cooled stages of the PTR.

The conduit 9 further comprises a needle valve 8, which provides a flow impedance resulting in a pressure differential in the conduit 9 between a high pressure side upstream of the needle valve, and a low pressure side downstream of the needle valve. Isenthalpic expansion of the coolant fluid through the needle valve 8 provides further cooling of the coolant fluid down to a temperature of approximately 1.5 K depending on the coolant fluid used. The coolant fluid subsequently exits the cryostat 10 and returns to the circulation pump 1 through the conduit 9, thereby completing the circuit.

The system 100 comprises a combination of filters and traps shown at 2, 3, 4, 5 and 7 designed to remove contaminates from the coolant fluid and thereby reduce blocking within the conduit 9. These will now be described below.

On exiting the circulation pump 1, the coolant fluid firstly flows through a particulate filter 2. This filter has a flow path pitch of approximately 20 microns and is designed to remove particulate contaminants such as PTFE from the coolant fluid which may have originated from wear of the circulation pump 1.

The coolant fluid then flows through a molecular trap 3, which contains a zeolite and/or molecular sieve granules. The molecular trap 3 may also contain hydroscopic material. The coolant fluid enters the molecular trap through an entrance port 3a, and exits through exit port 3b located downstream of the entrance port. As the coolant fluid flows through the molecular trap 3, contaminates such as water/moisture and/or hydrocarbons are adsorbed by the zeolite and/or molecular sieve granules within the trap and thus removed from the coolant fluid. The molecular trap 3 is typically connectable in series with the conduit, and removable such that it may be retro-fitted to existing systems, or may be removed for maintenance and the like. Alternatively however, the conduit 9 may form the outer body of the molecular trap 3 containing the adsorbent material.

Both particulate filter 2 and molecular trap 3 are at ambient (typically room) temperature.

The conduit 9 comprises a further particulate filter 4 downstream of the molecular trap. This filter is operable to remove contaminant zeolite from the molecular trap 3 and any further particulates originating from the pump. The particulate filter 4 is typically at room temperature; however, in an alternative embodiment, the particulate filter is cooled, either by being a part of the cryotrap 5, or through being in thermal communication with the cryotrap 5 (see below).

When the coolant fluid has passed through particulate filter 4, it flows into the cryotrap 5 situated within the cryostat 10. The cryotrap 5 comprises a hollow metallic cylinder having an entrance port 5a and an exit port 5b, connectable in series with the conduit 9. However, other geometrical volumes are envisaged, and in one example, the conduit 9 forms the outer body of the cryotrap such that the cryotrap 5 and the conduit 9 are a unitary member. The cryotrap 5 is filled with a high surface area material on to which contaminants within the coolant fluid condense or freeze. Coolant fluid within the conduit 9 flows into the cryotrap 5 through the entrance port 5a, flows over the high surface area material and exits through the exit port 5b.

The cryotrap 5 is in thermal communication with the first stage of the PTR, thereby cooling it to a temperature typically in the range 30-77K, although other means of cooling the cryotrap to the desired temperature are envisaged. The cryotrap 5 further acts as a heat exchanger between the PTR stage and the conduit, thus providing cooling to the coolant fluid flowing through the cryotrap 5. Contaminants in the coolant fluid with a boiling point above the temperature of the coolant fluid therefore condense or freeze out of the coolant fluid onto the surface by cryogenic pumping. The cryotrap 5 is typically operable to remove from the coolant fluid any contaminant nitrogen, oxygen, argon, carbon dioxide and remaining water, moisture or hydrocarbons not removed by the molecular trap 3, or present due to outgassing from the conduit between the molecular trap 3 and the cryotrap 5. Depending on the temperature of the cryotrap 5, different contaminates will be removed by cryogenic pumping.

As described hereinabove, the coolant fluid then flows through heat exchanger 6. The arrangement of the traps and filters 2, 3, 4 and 5 advantageously reduce blocking due to contaminants in heat exchanger 6, which is particularly prone to blockages due to its small cross-sectional diameter.

Subsequent heat exchange with the second cooled stage of the PTR cools the coolant fluid to a temperature in the range of approximately 3-50K, although base temperatures of 2K can be obtained. The coolant fluid then flows through a hydrogen filter 7 located upstream of the needle valve 8. The hydrogen filter 7 is an ultra-fine filter with a pitch of approximately 0.1 to 10 microns in order to trap hydrogen snow caused by hydrogen gas freezing within the coolant fluid.

The hydrogen filter has a high aspect ratio between its total diameter and its thickness, where the diameter here is perpendicular to the flow of coolant fluid. This advantageously means that there is a low impedance to coolant fluid flow within the hydrogen filter, even as the amount of hydrogen in the trap accumulates. The coolant gas subsequently flows from the hydrogen filter to the flow impedance within the circuit.

A main source of the hydrogen gas is outgassing from the stainless steel walls of the conduit 9. The filter 7 is made up of sintered metal and is cooled to a temperature lower than that of the freezing point of hydrogen in the coolant fluid. Since the temperature of the coolant fluid flowing through the hydrogen filter is typically lower than the freezing point of hydrogen, the hydrogen filter is typically cooled simply by the throughflow of the coolant gas. However, other means of cooling the hydrogen filter 7 are envisaged, such as a thermal connection to the second cooled stage of the PTR. As the hydrogen filter is located upstream of the impedance, has a large surface area perpendicular to the direction of coolant fluid flow and is cooled to below the freezing point of hydrogen, dendritic growth of hydrogen is forced to occur on the hydrogen filter rather than within the impedance. This advantageously reduces blocking of the impedance.

The hydrogen filter is located within the conduit and is removable from the conduit, allowing retro-fitting to existing refrigerator systems, and removal for maintenance and the like.

After the coolant fluid has passed through the needle valve 8, it flows through the remainder of the conduit 9 and back to the circulation pump 1, where it is re-pumped through the circuit.

The refrigeration system 100 optionally further comprises valves 11, 12 situated in the conduit 9, as seen in FIG. 1. Valve 11 is located upstream of particulate filter 4, and valve 12 is located downstream of the needle valve 8, with both valves 11, 12 being situated outside of the cryostat 10. The valves 11, 12 may be needle valves, solenoid valves or ball valves for example. In use, once a cooling cycle is complete, valve 11 is closed and the coolant fluid is pumped back to storage tank 14 through open valve 14e, removing coolant fluid from the cooled circuit. Valves 12 and 14a are then closed whilst the system is still cold in order to isolate the section of the circuit (indicated at 15) passing through the cryotrap 10 from the reminder of the circuit. As the section 15 warms, contaminants trapped by cryotrap 5 and hydrogen filter 7 (and optionally filter 4) outgas into the conduit. Valve 13 situated in contaminant conduit 16 is then opened and the contaminants are pumped away from the cooled circuit along the contaminant conduit 16.

The outgassing of the contaminants regenerates the cryotrap 5 and hydrogen filter 7. In order to increase the rate of outgassing from the cryotrap 5 and the hydrogen filter 7, optional heaters may be used to increase the rate of warming of the circuit section 15, and in particular the cryotrap 5 and the hydrogen filter 7.

In a similar manner to the cryotrap 5 and the hydrogen filter 7, an optional heater may be used to heat molecular trap 3 once valves 11, 12 and 14a are closed. Contaminants outgassing from the heated molecular trap 3 are pumped out of the cooling circuit using an additional valve and pumping port (not shown). An additional valve located between the supply conduit 9a and the molecular trap 3 may optionally be included to allow more of the coolant fluid to be pumped back to storage tank 14 and to allow the molecular trap 3 to be isolated from the pump 1 during its regeneration.

The particulate filter 2 is typically regenerated by being cleaned or replaced. In order to begin a subsequent cooling cycle, valve 13 is closed and valves 11, 12, 14a are re-opened, such that coolant fluid from the storage tank 14 may be pumped through the cooled circuit.

Although the invention is described above in relation to a refrigeration system comprising a closed cooled circuit and a cryostat, the invention is suitable for use in any cryogenic refrigeration system where a coolant fluid is pumped through a conduit.

Application to Magnetic Resonance Imaging Systems

Figure 2:
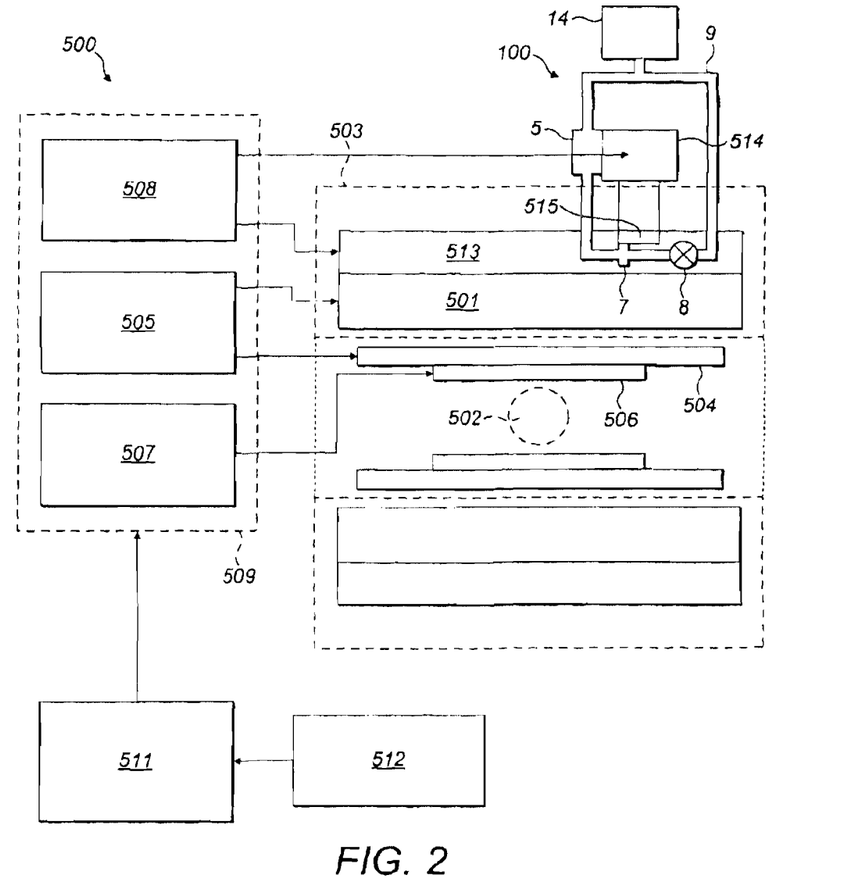

FIG. 2 illustrates an example application of a cryogenic refrigeration system in providing cooling power to a magnetic resonance imaging system. The magnetic resonance imaging system 500 includes a primary magnet system 501. The primary magnet system 501 includes a main field magnet arranged in the form of superconducting coils wound on a former in a solenoid arrangement. It will be understood that other magnets are present within the system for ensuring magnetic field correction, including shimming magnets, to ensure that the magnetic field generated within a target region of interest 502 within the centre of the solenoid arrangement is sufficiently highly homogeneous in order to produce highly spatially resolved signals. In a medical environment, part of the body of a patient to be investigated is positioned within this target region 502. When in use, the superconducting coils are maintained below their superconducting transition temperature by placing them in thermal contact with a heat sink of some kind, and ensuring they are held in a cryostat 503 which provides a highly thermally insulated environment.

According to the principles of MRI, the spatial information from within the target region is obtained by analysing radio-frequency (RF) signals received from material within the target region when such a region is subjected to magnetic field gradients. The magnetic field gradients are generated by gradient field coils 504 under the control of a magnet controller 505 which controls the gradient field coils 504 and the primary magnetic field system 501. The gradient coils produce magnetic field gradients in three orthogonal directions using resistive magnets since the field strength required is much lower. It is advantageous to place the gradient field coils 504 close to the target region and therefore within the solenoid bore. Similarly, an RF transmitter/receiver 506, which transmits and receives radio frequency signals from the target region is advantageously placed close to the target region 502, again, as shown in FIG. 2, within the solenoid bore. The transmitter/receiver 506 is controlled using an RF controller 507. A cooling system controller 508 controls the cooling of each cooled component of the MRI system 500, such as the primary magnetic field system. The magnet controller 505. RF controller 507 and cooling system controller 508 are in turn each operated as part of a system controller 509.

As will be understood by those of ordinary skill in the art, the formation of meaningful imaging data from the RF signals received from the target region under the respective gradient conditions requires advanced and substantial computational resources. These are provided within the present example system by the image acquisition and processing system 511. The example system in practice will include other components and apparatus, for example including patient monitoring, safety monitoring, data storage and more. Each is not shown in FIG. 2 although will be understood to be present. The skilled operator of the MRI system controls the system through the user interface 512. As will be understood, the controllers and other apparatus described above are generally implemented using computer software and electronics.

We turn now to the cooling system itself which is shown at 513 in FIG. 2, this being under the operational control of the cooling system controller 508. As an example of an implementation of the cooling system 513, the magnetic field coils of the superconducting primary magnet system 501 are placed in contact with a heat sink by being surrounded by liquid cryogen such as helium-4. In a practical implementation of a high-temperature superconductor used for the primary magnet windings, then the coolant could be a different liquid such as nitrogen. In the present example the low temperature superconducting coils are immersed within a reservoir forming part of the cooling system 513. The liquid cryogen absorbs heat over time and this causes boil-off into a head space within an upper region of the cooling system 513. The cooling system 513 provides cooling power through the use of a cryogenic refrigeration system of the form discussed earlier, namely being less prone to blockages.

The cryogenic refrigeration system is shown schematically at 100 and for simplicity only the storage tank 14, cryotrap 5, hydrogen filter 7 and needle valve 8 are shown. In this case the cryotrap is in thermal communication with the first (higher temperature) stage 514 of a PTR, and the hydrogen filter is in thermal communication with the second (lower temperature) stage 515 of the PTR. The needle valve 8 is positioned within the interior of the reservoir within the head space mentioned above. Thus, the gaseous boiled-off helium is recondensed by cryogenic refrigeration system 100 (since its operational temperature after coolant fluid has passed through the needle valve 8 is below the condensation point of the liquid helium) and the liquid helium is returned to the reservoir to provide further cooling. In this manner the system may be used in a "lossless" state whereby effectively no helium is lost from the system during operation, since all helium which is boiled-off is ultimately recondensed by the cryogenic refrigeration system. Further, due to the reduction in blockages experienced by the cryogenic refrigeration system, the amount of downtime of the MRI system 500 is substantially reduced due to the reduced frequency of cleaning required.

Rather than immerse the material in a bath of effectively static fluid it is conceivable to use an externally pumped circuit to provide flowing cryogen so as to cool the superconductor. This causes technical challenges in terms of engineering such a flow path which provides sufficient heat sinking of all parts of the magnet. Furthermore, whilst liquid coolant may be preferred, it is possible, particularly for high temperature superconductors, to consider gaseous cooling (since the superconducting transition temperature is above the boiling point of the liquid cryogen). A cooling system embodying such a pumped flow path, where part of the flow circuit is cooled using a cryogenic refrigeration system, is contemplated as an alternative example cooling system 513.

At the forefront of such developments is the desire to deliver the cooling power directly from a cryogenic refrigeration system to the magnet coils using conductive cooling through a solid high thermal conductivity material, rather than use cryogenic fluids. Some such designs have been proposed and in these cases it is particularly important to provide a close approach between the cooled stage of the cryogenic refrigeration system, such as needle valve 8, and the superconducting material. In principle this may also be achieved using the cooling system 513. It may be necessary in practice to provide multiple instances of the cryogenic refrigeration system in the above examples, particularly in the conductive cooling case here.

In each of the above examples of providing cooling power to the superconducting material there is advantage in providing the cryogenic refrigeration system within a short distance from the material to be cooled. This reduces the volumes of coolant required, the additional sources of heat input and the overall cost.

Whilst the above discussion is focussed upon the cooling of the primary magnet system 501, it has been proposed that cryogenic refrigeration systems may be useful in the cooling of other parts of an MRI system. For example, it has been proposed that an RF transmitter/receiver system may be implemented using coils which are cooled. These may be implemented as superconducting coils in which case they require to be cooled below their superconducting transition temperature. The improved cryogenic refrigeration systems discussed herein may also be used to improve the cooling of such coils (either resistive or superconducting), for example by cooling a flow path of circulating coolant which may be at cryogenic temperature.

The invention claimed is:

1. A cryogenic refrigeration system comprising a conduit arranged as a cooling circuit through which a coolant fluid is pumped, the conduit being in thermal communication with a least one cooled stage for cooling the coolant fluid to a first temperature,
    wherein the conduit comprises a cryotrap in communication with the coolant fluid, the cryotrap being operable to remove contaminants from the coolant fluid by cryogenic pumping,
    wherein the conduit also comprises a flow impedance for cooling the coolant fluid to a second temperature lower than the first temperature, and a hydrogen filter upstream of the flow impedance and in communication with the coolant fluid, the hydrogen filter being cooled to a temperature below the freezing point of hydrogen in the coolant fluid and operable to remove contaminant hydrogen from the coolant fluid, the hydrogen filter further having a diameter perpendicular to a flow direction that is larger than the length of the hydrogen filter in the flow direction,
    wherein the conduit further comprises a molecular trap upstream of the cryotrap, and wherein the molecular trap comprises a zeolite, and
    wherein the conduit yet further comprises a particulate filter downstream of the molecular trap and upstream of the cryotrap, the particulate filter being operable to remove contaminant zeolite that has passed out of the molecular trap.

2. The cryogenic refrigeration system according to claim 1, wherein the cryotrap is in thermal communication with the at least one cooled stage.

3. The cryogenic refrigeration system according to claim 1, wherein the at least one cooled stage is a cooled stage of a cryocooler.

4. The cryogenic refrigeration system according to claim 1, wherein the at least one cooled stage is a reservoir containing a cryogenic liquid.

5. The cryogenic refrigeration system according to claim 1, wherein the cryotrap comprises an entrance port and an exit port, the entrance port being upstream of the exit port.

6. The cryogenic refrigeration system according to claim 1, wherein the hydrogen filter is downstream of the cryotrap.

7. The cryogenic refrigeration system according to claim 1, wherein the hydrogen filter comprises another particulate filter.

8. The cryogenic refrigeration system according to claim 7, wherein the pitch of the another particulate filter is smaller than 10 microns.

9. The cryogenic refrigeration system according to claim 7, wherein the pitch of the another particulate filter is greater than 0.01 microns.

10. The cryogenic refrigeration system according to claim 7, wherein the another particulate filter comprises a sintered metal filter.

11. The cryogenic refrigeration system according to claim 7, wherein the hydrogen filter is in thermal communication with a second cooled stage, wherein the second cooled stage is cooled when in use to a temperature lower than the freezing point of hydrogen in the coolant fluid.

12. The cryogenic refrigeration system according to claim 7, wherein the hydrogen filter is in thermal communication with the flow impedance.

13. The cryogenic refrigeration system according to claim 12, wherein the hydrogen filter and the flow impedance are formed as a unitary member.

14. The cryogenic refrigeration system according to claim 1, wherein at least one of the cryotrap and the hydrogen filter has an associated heater.

15. The cryogenic refrigeration system according to claim 1, wherein the molecular trap has an associated heater.

16. The cryogenic refrigeration system according to claim 1, wherein the coolant fluid is pumped by a circulation pump, and wherein the conduit yet further comprises a further particulate filter downstream of the circulation pump operable to remove contaminants introduced into the coolant fluid from the circulation pump.

17. The cryogenic refrigeration system according to claim 1, wherein the at least one cooled stage and the flow impedance are contained within a cryostat.

18. The cryogenic refrigeration system according to claim 1, wherein the hydrogen filter is removable from the conduit.

* * * * *